United States Patent [19]

Vachon et al.

[11] Patent Number: 4,866,108

[45] Date of Patent: Sep. 12, 1989

[54] FLEXIBLE EPOXY ADHESIVE BLEND

[75] Inventors: David J. Vachon, Torrance; Ralph D. Hermansen, Northridge; Steven E. Lau, Los Angeles, all of Calif.

[73] Assignee: Hughes Aircraft Company, Los Angeles, Calif.

[21] Appl. No.: 144,909

[22] Filed: Jan. 19, 1988

[51] Int. Cl.$^4$ ............................................. C08L 63/00
[52] U.S. Cl. ..................... 523/428; 523/457; 523/466; 523/309; 523/456; 428/40; 428/215; 156/230
[58] Field of Search ..................... 523/428; 528/103.5, 528/361

[56] References Cited

U.S. PATENT DOCUMENTS

| | | | |
|---|---|---|---|
| 2,682,515 | 6/1954 | Naps | 523/428 |
| 4,211,685 | 7/1980 | Konovenko | 523/428 |
| 4,304,694 | 12/1981 | Scola | 523/428 |
| 4,488,282 | 12/1984 | Chung | 523/428 |

Primary Examiner—C. Warren Ivy
Attorney, Agent, or Firm—M. E. Lachman; W. J. Streeter

[57] ABSTRACT

A flexible epoxy adhesive composition comprising a mixture of a fatty acid modified epoxy resin and an oxypropylene epoxy resin in the ratio of about 1:3 to 1:1. The adhesive paste also includes a stoichiometric amount of a polyamine curing agent, 1 to 20 total liquid weight percent of a plasticizer and 1 to 5 weight percent of microfine silicon dioxide particles. Fillers, such as aluminum oxide and glass beads, are optionally added. This adhesive paste is particularly well suited for use as a flat pack adhesive to provide a releasable bond and is also well suited for use in space applications.

14 Claims, No Drawings

FLEXIBLE EPOXY ADHESIVE BLEND

This invention was made with United States Government support under Contract No. F04701-83-C-0025 awarded by the Department of the Air Force. The U.S. Government has certain rights in this invention.

BACKGROUND OF THE INVENTION

1. Field of the Invention

The present invention relates generally to adhesives used to bond electronic components to circuit boards. More particularly, the present invention relates to flexible epoxy based compounds which are designed to provide releasable bonding of the electronic components to circuit boards.

2. Description of Related Art

The design and fabrication of electronics typically involves bonding the electronic components to circuit boards using glass cloth or other suitable fiber cloth impregnated with a "flat pack" adhesive. The term "flat pack" is used herein to mean an electronic component or module having at least one flat or planar surface.

There are a number of specific characteristics which flat pack adhesives must have in order to provide adequate bonding of electronic components. The flat pack adhesive should have high thermal conductivity, on the order of 0.3 (BTU) (Ft)/(Ft$^2$) (hour) (°F.), in order to remove heat generated by the electronic component. These high levels of thermal conductivity are typically achieved by loading the adhesive with relatively high amounts of fillers such as alumina and other heat conductive materials. Accordingly, the flat pack adhesive must be capable of retaining its adhesive qualities even at the high filler loadings required to achieve desired rates of thermal conductivity.

The flat pack adhesive should have dielectric properties which include volume resistivity, dielectric strength, dissipation factor and dielectric constant comparable to good insulators. Lap shear strengths on the order of 100 psi to 500 psi are also necessary. In addition, for use in space applications, the adhesive must meet National Aeronautics and Space Administration (NASA) outgassing standards. Furthermore, the flat pack adhesive must be thermally stable to provide sufficient flat pack bonding throughout the range of temperatures to which spacecraft electronic components are subjected.

In addition to the above physical and chemical requirements, the flat pack adhesive must also meet certain criteria in order for it to be commercially acceptable. For example, the adhesive formulation must be capable of being stored as a premix material which can be ready for use at any time. Preferably, the adhesive formulation should be capable of being stored as a frozen premix at temperatures of $-40°$ F. for periods of at least three months. Moreover, the adhesive should have a relatively short cure time at reasonably low temperatures. For example, cure times on the order of 20 minutes at temperatures of up to 200° F. are desirable. Further, when used in the form of a film adhesive, it is sometimes advantageous that the viscosity and handling characteristics of the material are such that it can be easily, reliably and reproducibly impregnated into the various fiber cloths for final use in bonding the electronic components to circuit boards.

An additional requirement of the flat pack adhesive is the ability to function as a releasable adhesive It is very desirable in many electronic systems that the ability be provided to remove individual components from the circuit board. This allows removal and replacement of individual defective or obsolete components without having to replace the entire circuit board. Accordingly, it is important that the flat pack adhesive be sufficiently strong to prevent the electronic components from vibrating loose, while still allowing removal of the component when desired without damage to the component or the circuit board. The term "releasable bond" as used herein is intended to mean a bond which holds two surfaces together but which may be broken, if desired, without damaging either surface.

Currently, flat pack bonding is accomplished with traditionally used polysulfide adhesives. However, polysulfides have been shown to possess poor thermal stability in a vacuum (i.e. space environment) which results in unacceptable outgassing. Recently, polyurethane adhesives have been used for flat pack bonding. The polyurethane adhesives meet many of the above-described requirements for flat pack bonding. However, polyurethane does not work well as a frozen film adhesive due to condensation of water upon thawing and subsequent reaction of water with the diisocyanate component of the adhesive generating carbon dioxide gas. The gas forms permanent voids and bubbles in the cured adhesive.

Flexible polyglycol based epoxy formulations have not previously been used as flat pack adhesives. Flexible epoxy resins are generally not recommended by their manufacturers for use as the main constituent for general applications due to their inherent weakness.

There presently is a continuing need to develop flat pack adhesives which meet all of the desirable physical, chemical and commercial requirements necessary to provide releasable bonding of electronic components to circuit boards in general, and, more specifically, for spacecraft applications.

SUMMARY OF THE INVENTION

In accordance with the present invention, flat pack adhesives are provided which meet substantially all of the requirements necessary for use in electronics in general, and spacecraft in particular.

The present invention is based on the use of a mixture of flexible epoxy resins, plasticizer and polyamine curing agent which can accept a variety of fillers at high loadings, up to about 80 percent, while remaining elastomeric and providing lap shear strengths that are acceptable for releasable flat pack bonding.

In accordance with the present invention, it was discovered that acceptable flat pack adhesives could be prepared by adding a flexible fatty acid modified epoxy resin to a flexible oxypropylene epoxy in order to achieve the desired characteristics for a suitable flat pack adhesive. The ratio of a flexible fatty acid modified epoxy to flexible oxypropylene epoxy which provides the desired characteristics is from about 1:3 to 1:1. This epoxy mixture is capable of accepting up to 80 weight percent of fillers, such as aluminum oxide powder and glass beads, while still providing the desired releasable bonding characteristics which are required for removable flat packs.

As a feature of the present invention, microfine silicon dioxide is incorporated into the epoxy mixture to prevent separation of resin and alumina filler, to provide the desired viscosity, and to meet processing, thixotropy and wetting requirements. In addition, it was discovered that the microfine silicon dioxide is effective in preventing the plasticizer from bleeding out of the mixture during cure.

The present invention provides an epoxy mixture which can be modified by the addition of various additives and fillers to meet the wide variety of specific physical and chemical requirements set forth previously while still providing the basic releasable bonding feature which is desirable for a flat pack adhesive.

The above-discussed and many other features and attendant advantages of the present invention will become better understood by reference to the following detailed description.

DESCRIPTION OF THE PREFERRED EMBODIMENTS

The adhesive compositions of the present invention have wide application to the bonding of any two surfaces, in which releasable bonding is required. The following description will be limited to a discussion of the use of the adhesives as a "flat pack" adhesive with it being understood that the adhesive is not limited to such use.

The present adhesive is based upon a mixture of flexible epoxies, which is a combination of a liquid fatty acid modified epoxy resin and an oxypropylene epoxy resin. The ratio of fatty acid modified epoxy resin to oxypropylene epoxy resin in the epoxy mixture is from about 1:3 to about 1:1. Preferred mixture ratios are from 1:1.5 to 1:2. The fatty acid modified epoxy resin is a diglycidyl ester of linoleic dimer acid having an epoxide equivalent weight of between 390–470 or an adduct of 2 mole of diglycidyl ether of bisphenol A with 1 mole of linoleic dimer acid, said adduct having an epoxide equivalent weight of about 650–750. Liquid fatty acid modified epoxy resins of this type are available commercially from Shell Chemical Company as EPON 871 and EPON 872. The use of EPON 871 is preferred; however, EPON 872 can be used when desired. EPON 872 tends to increase the viscosity of the liquid adhesive and requires an adjustment of the amount of polyamine curing agent to account for changed stoichiometry EPON 871 has an equivalent weight of between 390–470 and a viscosity in centipoises at 25° C. (Durren's m.p., °C.) of 400–900. EPON 872 has an equivalent weight of between 650–750 and is a semisolid.

The other flexible epoxy resin is a diglycidyl ether of poly(oxypropylene) glycol having an equivalent weight of between about 170 to 210. Such flexible epoxies are also available commercially. Suitable ones include those marketed by Dow Chemical Company as DER 736 and DER 732. DER 736 is preferred DER 732 has an equivalent weight of 305–335 and a viscosity of 55–100 cps at 25° C. DER 736 has an equivalent weight of 175–205 and a viscosity of 30–60 cps at 25° C.

The amount of epoxy mixture in the adhesive composition can be varied widely provided that the relative ratios of the two epoxies remains within the ratios set forth above. When used as a flat pack adhesive, the preferred amount of epoxy mixture is between about 20–30 weight percent with the remainder of the adhesive being made up of filler materials, curing agent and plasticizer. Preferred levels for the oxypropylene epoxy is between about 15–19 weight percent.

The curing agent can be any of the conventional polyamine curing agents commonly used for curing epoxy resin mixtures provided that the boiling point of the curing agent be at least 100° C. High boiling point insures against migratory contamination. Furthermore, the curing agent should be free of impurities which could be outgassing contaminants for space applications. The preferred curing agent is 1,6-hexane diamine. The amount of curing agent added to the mixture should be a stoichiometric amount. This amount can be calculated by standard methods based upon total amount of epoxy mixture and relative amounts of fatty acid modified epoxy resin and oxypropylene epoxy resin contained therein. For adhesives where the epoxy mixture comprises between about 20 to 30 weight percent of the adhesive, the amount of 1,6-hexane diamine added to the mixture should be between about 2 to 4 weight percent.

The plasticizer which is added to the adhesive composition is between 1 to 20 weight percents of total liquids. The total liquids include the epoxy mixture plasticizer and curing agent. Accordingly, 1 to 20 weight percent of these liquids is equivalent to about 0.2 to 6.8 weight percent of the total adhesive mixture since the liquids are present in an amount of from 22 to 35 weight percent of the total adhesive. Suitable plasticizers must have similar structure to the flexible epoxy resins (i.e. poly(oxypropylene)) and preferably are branched and of high molecular weight. A suitable polyol plasticizer is LHT-34 which is available from Union Carbide Corporation. Dow Chemical, Wayandotte and Union Carbide companies also provide suitable polyols. LHT-34 is also known as glycerol-propylene oxide polyether triol. Other polyols such as any of the glycerol-propylene oxide polyether triols which are conventionally used as plasticizers are suitable. The amount of plasticizer should be between about 1.5 to 3.5 weight percent based on total liquids (0.5 to 1.5 weight percent based on total adhesive composition) for those adhesive compositions where up to 30 weight percent total epoxy mixture is used and wherein the fatty acid modified epoxy resin content is about 15 to 19 weight percent. Although the percentage of plasticizer in the adhesive composition can be as high as 20 percent of total liquids, it should be noted that the mechanical strength of the cured adhesive composition decreases as the plasticizer content increases. At levels of plasticizer above 20 liquid weight percent, the cured adhesive material tends to crumble. Also, at levels above 7 liquid weight percent of plasticizer, there is a tendency for the plasticizer to bleed from the adhesive during curing resulting in an oily film being left on the surface of the cured adhesive.

The adhesive composition also includes 1 to 5 weight percent of microfine silicon dioxide particles. Such microfine silicon dioxide particles preferably meet Military Specification MIL-S-47129, for "Microfine Silicon Dioxide". The silicon dioxide should be a fluffy, fine white powder such as that available from CABOT Corp., Cab-o-sil Division, Tuscola, Ill., under the trademark Cab-o-sil or as Aerosil available from Degussa Corp., Pigment Division (Teterboro, N.J.).

It was found that when the Cab-o-sil content of the adhesive composition is less than about 1.5 percent by weight, the polyol plasticizer tends to bleed out during curing of the adhesive composition. Accordingly, the amount of microfine silicon dioxide particles is preferably above about 1.5 percent by weight. In addition, the viscosity of the uncured adhesive composition rises rapidly with increases in silicon dioxide content. Accordingly, the preferred silicon dioxide particle content for most adhesive compositions is between about 1.5 to 3 weight percent.

In addition to the above required components of the adhesive mixture, the adhesive composition may optionally include additives to provide desired characteristics for flat pack bonding. Various known additives may be used to provide desired properties in addition to the releasable bonding characteristic of the mixture so long as the filler does not otherwise adversely affect the physical and chemical properties of the adhesive composition prior to and after curing.

The two preferred filler materials are aluminum oxide powder and/or glass beads. The total amount of filler should be less than 80 weight percent. The preferred amount of aluminum oxide is between about 55 to 75 weight percent. Aluminum oxide may be used by itself as the filler up to the 80 weight percent filler limit. Glass beads, on the other hand, are only suitable in amounts up to about 20 weight percent. Combinations of aluminum oxide powder and glass beads are possible so long as the above limitations are not exceeded.

The glass beads can be any of the well-known beads commonly used as adhesive fillers. These include beads made from ceramic materials, borosilicate glass, or any other suitable glass material conventionally used for glass filler beads. Preferred glass beads are 3 mil (0.075 mm) glass beads from Potter Industries. The diameter of the glass beads may be varied depending upon the end use for the adhesive. The diameter of the glass bead must, of course, be less than the thickness of the uncured adhesive layer. Preferably, the diameter of the glass beads is a few thousandths of an inch or below. It should be noted that viscosity of the uncured adhesive composition decreases as the glass bead content increases when the total filler level remains the same. In addition, at constant filler levels, the thermal conductivity of the adhesive decreases somewhat as the alumina level decreases and glass bead content increases. Addition of glass beads in amounts of between 8-10 weight percent is preferred. If a very thin layer of adhesive is required, the glass beads should be omitted.

The adhesive composition of the present invention is formulated to have in combination: high thermal conductivity at high filler loading, good dielectric or insulator properties, a specified lap shear strength, good thermal stability, a short cure time at a relatively low temperature, good low-temperature storage, low out-gassing properties to meet NASA requirements, and a controlled or predetermined bond strength such that a releasable bond is formed.

An example of a preferred adhesive composition formulation in accordance with the present invention is as follows:

| MATERIAL | Parts by Weight ± 1.0% |
| --- | --- |
| EPON 871 Epoxy Resin | 10.0 |
| DER 736 Epoxy Resin | 18.0 |
| Hexane Diamine | 3.5 |
| LHT-34 Triol | 2.5 |
| Cab-o-sil Silica | 2.5 |
| Alumina Powder, 325 Mesh | 63.5 |

The above formulation was found to have a useful work life of at least two hours and a storage life of at least three months when stored in an unopened syringe at a temperature of no higher than $-40°$ F. The material was an off-white material which had a Type A Durometer hardness of 80-90 after it had been cured. Curing was accomplished by heating the composition at about 200° F. (93° C.) for about one hour. Curing is preferably started within 30 minutes after the adhesive is applied.

The lap shear strength for the cured material at room temperature was between 100 to 500 lbs. per square inch (0.69 to 3.45 megapascals). The glass transition temperature for the cured material was less than 40° F. (4° C.) and the coefficient of thermal expansion above the glass transition was less than $9.5 \times 10^{-5}$ inches/inch degrees F ($17.1 \times 10^{-5}$ mm/mm degrees C.). Below the glass transition, the cured material had a coefficient of thermal expansion which was less than $2.9 \times 10^{-5}$ inches/inch degrees F ($5.2 \times 10^{-5}$ mm/mm degrees C.). The cured material exhibited a total mass loss of less than 1.0 percent (after allowing for water vapor recovery), with collected volatile condensable material being less than 0.1 percent. The volume resistivity of the cured material was more than $1 \times 10^{11}$ ohm-centimeters at $77° \pm 5°$ F. ($25° \pm 3°$ C.).

Another preferred adhesive composition in accordance with the present invention is as follows:

| MATERIAL | Parts by Weight ± 1.0% |
| --- | --- |
| EPON 871 Epoxy Resin | 9.0 |
| DER 736 Epoxy Resin | 15.6 |
| LHT-34 Triol | 2.4 |
| Hexane Diamine | 3.0 |
| Cab-o-sil Silica | 1.5 |
| Alumina | 59.5 |
| Glass Beads | 9.0 |

This second composition is similar to the first composition except that the relative amount of flexible epoxy is decreased and glass beads are added. Amounts of other ingredients are also changed to give desired final properties. The glass beads are 3 mil (0.075 mm) glass beads obtained from Potter Industries, Pacific Division, Anaheim, California. This second composition was also cured at temperatures around 200° F. (93° C.) for about one hour. The second composition is preferably used where thicker adhesive films are required, i.e. films above 0.015 inch (0.038 cm).

The method for preparing the adhesive compositions of the present invention was as follows:

(1) Weigh and mix together the two epoxy resins and the polyol. Continue mixing until after the hexane diamine has been added.

(2) Melt the necessary amount of the hexane diamine and add it to the polyol/epoxy mixture while it is still being mixed to avoid any crystallization of the hexane diamine.

(3) Add the Cab-o-sil and the Glass Beads (if applicable) to the liquid and stir with a stainless steel spatula. Then add the alumina, stir it into the mixture with the stainless spatula, and blend the entire mixture thoroughly with a high-shear mixing blade at approximately 2500 revolutions per minute (rpm).

(4) De-gas the paste as much as possible by vacuum, and finish the de-gassing process by centrifuging the paste for approximately 2 min. at 3500 rpm. (If a planetary mixer is used, the pot can be evacuated and centrifuging is not necessary.)

(5) Freeze the paste until needed. Store at-40° C.

The preferred use for the adhesive paste of the present invention is as a flat pack adhesive. However, the present adhesive paste may be applied to any suitable substrate and used in any situation where a semi-flexible releasable bond is required. The adhesive paste may be used in the same manner as other flat pack adhesives. A carrier is provided for the uncured adhesive paste in order to provide support for the uncured paste after thawing and, in the bonded structure, to provide a barrier to metal spurs or protrusions on the printed wiring board so that they do not contact the electronic component. The carrier may be provided, for example, by impregnating the paste into thin sheets of fiberglass cloth or other composite material cloth such as boron fiber cloth, polyimide fiber cloth, etc. The cloth thicknesses are typically 0.002 to 0.010 inch (0.005 to 0.025 cm). In a preferred embodiment, the adhesive impregnated cloth is then cured at 200° F. (93° C.) under an applied pressure of 50 psi. Optionally, the adhesive impregnated cloth may be used without curing.

Other suitable carriers include glass fabrics, Kevlar fabrics, cloth fabrics, plastic or composite sheeting or a thin film of the present cured adhesive composition. These latter materials need not be impregnated with the present adhesive composition. The carrier is coated on both sides with a thin layer of uncured adhesive paste. The exposed surface of the adhesive paste on each side is covered with a releasable film, such as polyethylene sheet, and then stored at-40° C. The releasable film provides surface protection for the uncured adhesive paste, as is known in the art. The structure comprising: (a) the carrier; (b) the layer of uncured adhesive paste on both sides of the carrier; and (c) the releasable film on the surface of each layer of uncured adhesive paste, is referred to herein as a "film adhesive". The thicknesses of the film adhesive can range from 0.005 inch (0.013 cm) to 0.020 inch (0.051 cm) depending upon the desired end use for the adhesive.

When used to bond an electronic component to a circuit board, a portion of the above-described film adhesive is cut large enough to cover the area to be bonded. The film adhesive is frozen on dry ice and then the protective layer can be easily removed, such as by using a tweezer, without removing any adhesive. The film adhesive is applied to the selected area on the circuit board, and the electronic component is then placed on top of the film adhesive, with the application of light pressure. The film adhesive is then cured at 200° F. (93° C.) for 15 minutes.

Optionally, the adhesive composition of the present invention may be used in the form of a paste. The paste is applied to the bottom surface of the electronic component with a spatula, and a thin layer of the paste is applied to the bond site on the circuit board. The component is placed on the bond site of the board and the adhesive is cured at 200° F. (93° C.) for 15 minutes. Alternatively, the paste may be used for filleting, in which paste is injected by means of a syringe along the edge of a component which has been soldered to a circuit board. The paste is then cured as described above. In this manner, a thermal transfer path is provided between the component and the board.

While the adhesive composition of the present invention has been described in detail with regard to its use for bonding electronic components to printed wiring boards, it is not intended to limit the present invention to this particular use. The present adhesive composition may be used wherever a releasable bond is required between two surfaces. Moreover, the present adhesive composition may be used wherever any or all of its unique properties of high thermal conductivity, good insulation, good lap shear strength, thermal stability, short cure time at relatively low temperature, good low-temperature storage, and low out-gassing, are required.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but are only limited by the following claims.

What is claimed is:

1. An adhesive composition comprising:
   (a) 20–30 weight percent of a liquid epoxy mixture comprising a first epoxy resin selected from the group consisting of the diglycidyl ester of linoleic dimer acid having an epoxide equivalent weight of between about 390–470 and an adduct of 2 moles of diglycidyl ether of bisphenol A with 1 mole of linoleic dimer acid, said adduct having an epoxide equivalent weight of about 650–750, and a second epoxy resin consisting essentially of a diglycidyl ether of poly(oxypropylene) glycol having an epoxide equivalent weight of between 170 to 210 or 305–335 wherein the weight ratio of said first epoxy resin to said second epoxy resin in from about 1:3 to 1:1;
   (b) a stoichiometric amount of a polyamine curing agent having a boiling point of at least 100° C.;
   (c) 0.2 to 6.8 weight percent of a polyol plasticizer;
   (d) 1 to 5 weight percent of microfine silicon dioxide particles; and
   (e) 80 weight percent or less of a filler material.

2. An adhesive composition according to claim 1 wherein said filler material is aluminum oxide or glass beads.

3. An adhesive composition according to claim 2 wherein the amount of said glass beads is about 20 weight percent or less.

4. An adhesive composition according to claim 1 wherein the amount of said first epoxy resin is between about 15 to 19 weight percent.

5. An adhesive composition according to claim 4 wherein the amount of said polyol plasticizer is between about 0.5 to 1.5 weight percent.

6. An adhesive composition according to claim 5 wherein the amount of microfine silicon dioxide particles is between about 1.5 to 3 weight percent.

7. An adhesive composition according to claim 6 wherein the amount of aluminum oxide is between about 55 to 75 weight percent.

8. An adhesive composition according to claim 7 wherein the amount of said polyamine curing agent is between about 2 to 4 weight percent.

9. An adhesive composition according to claim 8 wherein the amounts of the ingredients by weight percent are about: 10 percent said first epoxy resin, 18 percent diglycidyl ether of poly(oxypropylene) glycol, 3.5 percent polyamine curing agent, 2.5 percent polyol plasticizer, 2.5 percent microfine silicon dioxide and 63.5 aluminum oxide powder.

10. An adhesive composition according to claim 8 which further includes between about 8 to 10 weight percent glass beads.

11. An adhesive composition according to claim 10 wherein the amounts of the ingredients by weight percent are about: 9 percent diglycidyl ester of linoleic dimer acid, 15 to 16 percent diglycidyl ether of poly(oxypropylene) glycol, 3.0 percent polyamine curing agent, 2.4 percent polyol plasticizer, 1.5 percent microfine silicon dioxide, 59–60 percent aluminum oxide powder and 9 percent glass beads 12. An adhesive composition according to claim 1 wherein said polyamine curing agent is 1,6-hexane diamine.

13. An adhesive composition according to claim 9 wherein said polyamine curing agent is 1,6-hexane diamine.

14. An adhesive composition according to claim 11 wherein said polyamine curing agent is 1,6-hexane diamine.

* * * * *